US008180609B2

(12) United States Patent
Hollis

(10) Patent No.: US 8,180,609 B2
(45) **Date of Patent: *May 15, 2012**

(54) JITTERY SIGNAL GENERATION WITH DISCRETE-TIME FILTERING

(75) Inventor: Timothy M. Hollis, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/112,036

(22) Filed: May 20, 2011

(65) Prior Publication Data

US 2011/0224960 A1 Sep. 15, 2011

Related U.S. Application Data

(63) Continuation of application No. 11/847,543, filed on Aug. 30, 2007, now Pat. No. 7,953,579.

(51) Int. Cl.

| | |
|---|---|
| ***G06F 17/50*** | (2006.01) |
| ***G06F 17/10*** | (2006.01) |
| ***G06G 7/56*** | (2006.01) |
| ***G06G 7/62*** | (2006.01) |
| ***H03B 1/00*** | (2006.01) |
| ***H03D 1/04*** | (2006.01) |
| ***H04B 1/10*** | (2006.01) |
| ***G01R 27/28*** | (2006.01) |

(52) U.S. Cl. .................... 703/2; 703/5; 703/13; 703/14; 708/300; 327/552; 375/346; 375/350; 716/100; 702/117

(58) Field of Classification Search .................. 703/2, 5, 703/13, 14; 708/300; 327/552; 375/346; 716/100; 702/117

See application file for complete search history.

(56) References Cited

U.S. PATENT DOCUMENTS

| | | | | |
|---|---|---|---|---|
| 5,615,233 | A | 3/1997 | Baum et al. | |
| 5,802,118 | A | 9/1998 | Bliss et al. | |
| 6,185,509 | B1 * | 2/2001 | Wilstrup et al. | 702/69 |
| 6,356,850 | B1 | 3/2002 | Wilstrup et al. | |
| 6,598,004 | B1 * | 7/2003 | Ishida et al. | 702/69 |
| 6,711,598 | B1 | 3/2004 | Paré et al. | |
| 6,832,172 | B2 * | 12/2004 | Ward et al. | 702/69 |
| 7,167,516 | B1 | 1/2007 | He | |

(Continued)

OTHER PUBLICATIONS

Agilent Technologies, "New Signal Integrity Tools and Methods for High-Speed Digital Communications," Presentation, May 26, 2007.

(Continued)

*Primary Examiner* — Paul Rodriguez
*Assistant Examiner* — Nithya Janakiraman
(74) *Attorney, Agent, or Firm* — Wong Cabello; Lutsch, Rutherford & Brucculeri, LLP

(57) ABSTRACT

The computer-implementable method allows for the fast creation of a multi-unit interval data signal suitable for simulation. The created signal represents the output of an otherwise ideal Discrete Time Filter (DTF) circuit, and the quick creation of the signal merely requires a designer to input the number of taps and their weights without the need of laying out or considering the circuitry of the DTF. A matrix is created based on a given data stream, and the number of taps and weights, which matrix is processed to create the multi-unit-interval data signal. Noise and jitter can be added to the created signal such that it now realistically reflects non-idealities common to actual systems. The signal can then be simulated using standard computer-based simulation techniques.

25 Claims, 9 Drawing Sheets

U.S. PATENT DOCUMENTS

| | | | |
|---|---|---|---|
| 7,224,714 B1 | 5/2007 | Barman et al. | |
| 7,254,168 B2 | 8/2007 | Guenther | |
| 7,310,392 B2 | 12/2007 | Miller | |
| 7,388,937 B1 | 6/2008 | Rodger et al. | |
| 7,486,726 B2 | 2/2009 | Alexander et al. | |
| 7,519,489 B2 * | 4/2009 | Tietz et al. | 702/69 |
| 2002/0120420 A1 | 8/2002 | Wilstrup et al. | |
| 2004/0062301 A1 | 4/2004 | Yamaguchi et al. | |

OTHER PUBLICATIONS

Agilent Technologies & Huawei, "System Level Simulation & Verification Using Advanced Design System," Presentation, May 25, 2007.

* cited by examiner

JITTERY SIGNAL GENERATION WITH DISCRETE-TIME FILTERING

CROSS-REFERENCE TO RELATED APPLICATIONS

This application is a continuation of U.S. patent application Ser. No. 11/847,543, filed Aug. 30, 2007 (now U.S. Pat. No. 7,953,579), to which priority is claimed and which is hereby incorporated by reference in its entirety.

FIELD OF THE INVENTION

Embodiments of this invention relate to the generation of a signal indicative of the output of a discrete time filter to allow for simpler and more realistic simulation of the same.

BACKGROUND

Circuit designers of multi-Gigabit systems face a number of challenges as advances in technology mandate increased performance in high-speed components. For example, chip-to-chip data rates have traditionally been constrained by the bandwidth of input/output (I/O) circuitry in each component. However, process enhancements (e.g., transistor bandwidth) and innovations in I/O circuitry have forced designers to also consider the effects of the transmission channels between the chips on which data is sent.

At a basic level, data transmission between components within a single semiconductor device or between two devices on a printed circuit board may be represented by the system 10 shown in FIG. 1A. In FIG. 1A, a transmitter 12 (e.g., a microprocessor) sends data over channel 16 (e.g., a copper trace on a printed circuit board or "on-chip" in a semiconductor device) to a receiver 14 (e.g., another processor or memory). When data is sent from an ideal transmitter 12 to a receiver 14 across an ideal (lossless) channel 16, all of the energy in a transmitted pulse will be contained within a single time cell or unit interval (UI).

However, real transmitters and real transmission channels do not exhibit ideal characteristics, and as mentioned above, the effects of transmission channels are becoming increasingly important in high-speed circuit design. Due to a number of factors, including, for example, the limited conductivity of copper traces, the dielectric medium of the printed circuit board (PCB), and the discontinuities introduced by vias, the initially well-defined digital pulse will tend to spread or disperse as it passes through the channel 16. This is shown in FIG. 1B. As shown, a single pulse of data 105*a* is sent by the transmitter 102 during a given UI (e.g., UI3). However, because of the effect of the channel 104, this data pulse becomes spread 105*b* over multiple UIs at the receiver 106, i.e., some portion of the energy of the pulse is observed outside of the UI in which the pulse was sent (e.g., in UI2 and UI4). This residual energy outside of the UI of interest may perturb a pulse otherwise occupying the neighboring UIs, in a phenomenon referred to as intersymbol interference (ISI). The degree of the distortion caused by ISI is ultimately quantifiable through an understanding of the transfer function, H(z), of the channel 16. One skilled in the art will recognize that the channel transfer function has here been defined by the Z-transform. While in general the physical channel transfer characteristics are most accurately defined in the S-domain (Laplace domain), the discrete time nature of the methods to be described in this application are more readily addressed in terms of the discrete time Z-transform, and it is therefore more appropriate to discuss the channel characteristics in the same format for compatibility.

One known means for neutralizing the deleterious effects of channel-induced ISI comprises the use of a Discrete Time Filter (DTF) 13 on the transmitter 12 side of the system. The DTF 13 essentially pre-processes the data stream 11 of bits prior to the bits being driven onto the channel 16. Ideally, the DTF 13 has a transfer function, 1/H(z), which is the inverse of the transfer function H(z) of the channel 16. If the DTF's transfer function 1/H(z) is truly an exact inverse of the channel's transfer function H(z), then the DTF 13 will cancel the effects of the channel 16, and the data will be received at the receiver 14 without any distortion or ISI.

An exemplary DTF 13 is shown in FIG. 2. As shown, the DTF comprises N taps 22. (An ideal DTF would have an infinite number of taps). Each tap 22 weights a delayed contribution ($W_i$) to the overall output, with each tap being separated in time by a unit interval delay, ΔT, such that each Xth tap is delayed by (N-X) unit intervals. The overall output comprises the sum of the outputs of the taps, with the effect that preconditioning is added to the input data signal. Examples of DTFs and other filters or equalizers used for pre-conditioning transmitted signals to mitigate against ISI can be found in the following references, all of which are incorporated herein by reference in their entireties: R. W. Lucky et al., "Automatic equalization for digital communication," in Proc. IEEE, vol. 53, no. 1, pp. 96-97 (January 1965); R. W. Lucky and H. R. Rudin, "Generalized automatic equalization for communication channels," in Proc. IEEE, vol. 53, no. 3, pp. 439-440 (March 1966); S. Reynolds et al., "A 7-tap transverse analog-FIR filter in 0.13 μm CMOS for equalization of 10-Gb/s fiber-optic data systems," in Proc. IEEE Int. Solid-State Circuits Conf., pp. 330-331 (February 2005); M. E. Said et al., "A 0.5-μm SiGe pre-equalizer for 10-Gb/s single-mode fiber optic links," in Proc. IEEE Int. Solid-State Circuits Conf., pp. 224-225 (February 2005); and J. E. Jaussi et al., "8-Gb/s source-synchronous I/O link with adaptive receiver equalization, offset cancellation, and clock de-skew," IEEE J. Solid-State Circuits, vol. 40, no. 1, pp. 80-88 (January 2005).

While the tap delay typically corresponds to the unit interval of the signal, that is not a requirement. In many cases, the tap delay is set to a fraction of the unit interval. While such "fractionally-spaced" filtering adds complexity to the design, and generally increases the number of taps, it also provides better control of the filtering operation. Other modifications include variable tap delay.

That said, the most common form of DTF is a simple two-tap, unit-interval-spaced filter, wherein the first tap $\mathbf{22}_1$ is associated with the pulse peak or as illustrated in waveform 105*b* of FIG. 1B, UI3. The weight of this tap is often set to unity to leave the main pulse unaltered. The weight of the second tap $\mathbf{22}_2$, which corresponds to UI4 in FIG. 1B, is typically given a small negative value to subtract off the first ISI term in the pulse tail. In many cases, this level of filtering is sufficient, as the first post-pulse ISI term often dominates the degradation of the overall signal. When that is not the case, however, and many ISI terms must be countered, several filter taps may be necessary.

It is also possible for ISI to occur on the front edge of the pulse, and this can also be canceled by the DTF topology under consideration, a concept best understood by returning to FIG. 2. In this case, the unity weight would be applied to one of the middle taps in the filter (e.g., $\mathbf{22}_{N-2}$) while still corresponding to UI3 of waveform 105*b* in FIG. 1B. When this is done, the weights of taps $\mathbf{22}_N$ and $\mathbf{22}_{N-1}$ will address post-pulse ISI (UI4-UI5), while the weights of taps $\mathbf{22}_{N-3}$ down to tap $\mathbf{22}_1$ will address pre-pulse ISI (UI1-UI2).

It should also be noted that there need not be a unity gain tap weight. For example, when it is anticipated that the received pulse will be severely degraded in amplitude due to channel losses, then the tap which corresponds to the main pulse may be given a weight greater than one to boost the pulse height.

While DTFs can be a useful means to precondition data signals to combat channel-induced ISI, a DTF can be difficult to design. That is, it is not always clear the exact number of taps 22 or the corresponding weight values that should be used to compensate for a given channel. Accordingly, before one engages in constructing the DTF 13 at the transmitter 12, it is usually desirable to model and simulate the DTF 13 in light of the expected channel characteristics, with tap number and weight values determined through trial and error.

When designing such a pre-distorting filter for low-speed applications, the task of determining the optimal number of taps and the associated tap weights is simplified. This is because in such cases it is not uncommon for the channel itself to be modeled as a DTF with a finite number of taps. In this situation, designing the corresponding filter, exhibiting the inverse transfer function, is a somewhat trivial matter. Even when the channel model is more complex, as long as timing is less of a concern as it is in low-speed designs, the process of designing the optimal DTF remains relatively simple and is often carried out in mathematical tools like Matlab, independent of any component-level simulation.

High-speed systems are a different matter, in that the full analog, continuous-time nature of the signal, the channel, and the filter are all critical in the derivation of the optimal filter configuration. In addition, verifying the impact of the filter on the link performance requires circuit-level simulation to ascertain whether or not the filter has enabled error free communication, and this of course requires a waveform suitable for simulation in an industry standard simulator.

Unfortunately, modeling and simulation of the DTF is difficult. Even if the DTF is to be merely simulated, it is generally necessary to define the DTF in a layout simulator such as SPICE™. This requires transistors, resistors, and other discrete components to be electronically considered, even if they are not actually yet constructed or laid out. Such component-level consideration takes time and effort, which is particularly undesirable in an application in which one might be frequently changing the number of taps as well as the associated tap weights to try and find the most ideal transfer function 1/H(z) for the DTF to compensate for a given channel.

Furthermore, modeling and simulation may not provide a suitably accurate picture of how the DTF will process signals deviating from the ideal. Realistic data signals will not be ideal, but instead will suffer from various sources of amplitude noise and timing jitter, which noise and jitter may vary randomly between the unit intervals of the data. Regardless of the source or type of noise or jitter, it is difficult to quickly and efficiently simulate the effects of noise or jitter in the context of a DTF circuit. This inability to handle noise and jitter during simulation of the DTF circuit is especially problematic, because DTF circuits are particularly susceptible to noise and jitter, a point which is easy to understand when one considers that noise or jitter is in a sense multiplied by the various taps in the DTF.

DETAILED DESCRIPTION

The disclosed computer-implementable method allows for the fast creation of a multi-unit-interval vector suitable for simulation. The created vector represents the output of an otherwise ideal Discrete Time Filter (DTF) circuit, and the quick creation of the vector merely requires a designer to input into a computer system the number of taps and their weights without the need of laying out or considering the circuitry of the DTF. Specifically, a matrix is created in the computer system based on a given (preferably though not exclusively randomized) data stream of bits, and the number of taps and weights, which matrix is processed as disclosed herein to create the multi-unit-interval vector. Noise and jitter can be incorporated into the created vector such that it now realistically reflects non-idealities common to actual systems. Once created, the vector can then be simulated using standard computer-based simulation techniques, such as SPICE™. For example, the transmission of the created vector can be simulated down a channel having a particular transfer function, H(z). If the DTF parameters (number of taps and associated weight values) used to create the signal were designed to counter this transfer function (1/H(z)), the simulation can reveal how appropriate the original DTF parameters were. If the effects of the channel were not suitably countered, the number and weights of the taps of the DTF can be adjusted, the matrix re-processed to produce another vector for simulation, and simulation can occur again. This allows the DTF to be quickly modeled and simulated for a particular application without the need of actually laying out the DTF prior to the simulation or otherwise considering the DTF's specific circuit elements. This ultimately hastens the design and improves the accuracy of the DTF circuit to be built.

Figure 1A:
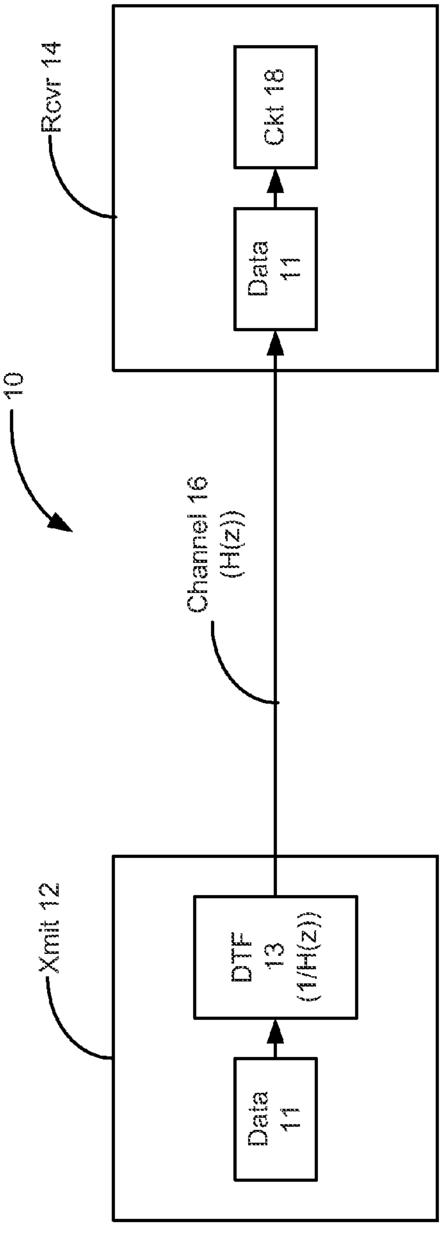
Figure 1A (prior art)
FIG. 1A illustrates a basic transmitter/receiver system for digital data, including a Discrete Time Filter (DTF) in the transmitter.
Figure 1B:
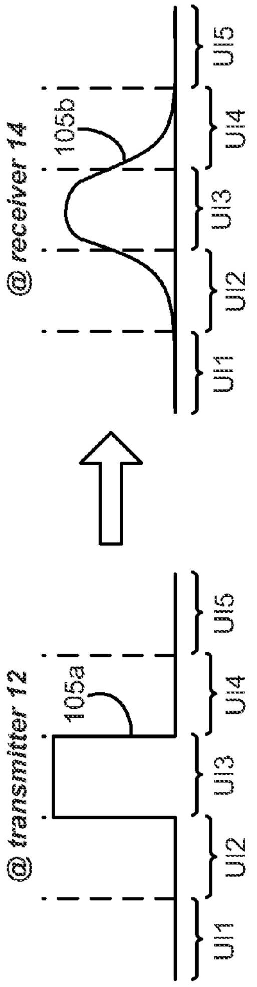
Figure 1B (Prior Art)
FIG. 1B illustrates how Inter-symbol Interference (ISI) affects an otherwise ideal pulse as it travels down a non-ideal channel.
Figure 2:
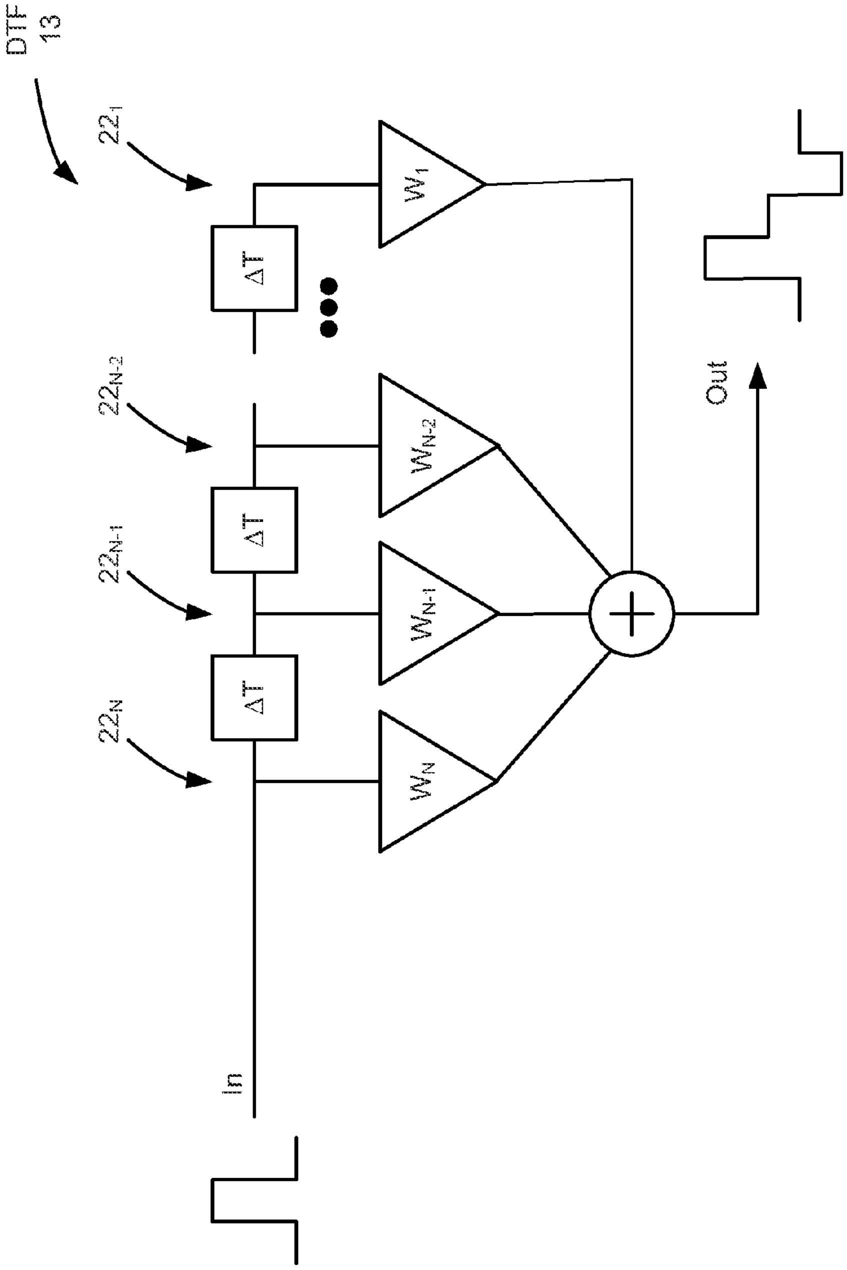
Figure 2 (prior art)
FIG. 2 illustrates the basic circuitry for DTF usable in the transmitter of FIG. 1A.
Figure 3:
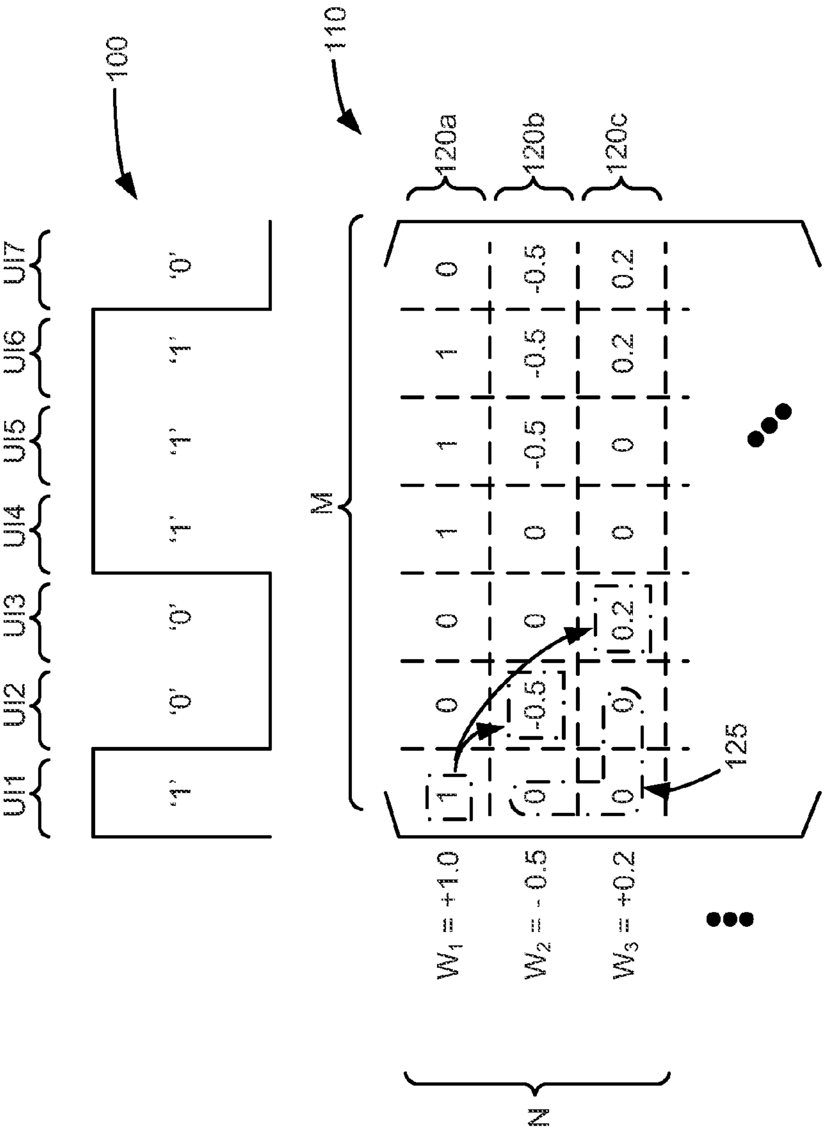
FIGS. 3-5 illustrate sequential steps in the disclosed process for using a unit-interval-based matrix to form a vector for simulation indicative of the output of the DTF of FIG. 2.

One implementation of the technique is illustrated starting with FIG. 3. The process starts with inputting an ideal input waveform 100 in the computer system, which computer system will be explained later. This waveform 100 represents a multi-unit-interval sequence of data bits which the designer of the DTF 13 would like to see simulated through the DTF 13/channel 16 system. Because a designer typically desires to simulate many bits incorporating many patterns, the input waveform 100 is generally random or pseudo-random, and will comprise a statistically-significant number of bits (or unit intervals). For example, the input waveform 100 might comprise thousands of unit intervals. However, only seven UIs (UI1-UI7) are shown in FIG. 3 for simplicity.

Once the input waveform 100 has been chosen, the designer next inputs the number of taps 22 to be used in the DTF 13, and their weights, W, into the computer system. As illustrated in FIG. 3, a three-tap DTF is assumed, which taps have weights of $W_1$=+1.0, $W_2$=−0.5, and $W_3$=+0.2. (As discussed in the Background, such a set of weight implies that only post-pulse ISI will be addressed). This example assumes that the designer has at least initially assumed that a DTF with these parameters will be suitable for neutralizing the transfer function of the channel 16—a hypothesis that can be tested later through simulation as will be discussed further below. However, as the ellipses in FIG. 3 indicate, more taps 22 could be used.

From this initial design assumption (number and weights of taps) for the design of the DTF 13, a matrix 110 is populated in the computer system as an intermediary step in the formation of the multi-unit-interval vector to be simulated. The matrix 110 comprises rows and columns, in which the number of columns M equals the number of UIs (bits) in the input waveform 100 (seven in this example), and the number of rows N equals the number of taps assumed for the DTF's design.

To make the illustration simple, it is assumed that the logic state '0' comprises 0 Volts, and that a logic state '1' comprises 1 Volt. This would be the likely scenario in a system 10 which had a power supply voltage (i.e., Vcc) of 1 Volt. This is merely exemplary, and other voltage values could be used for the two logic states and populated into the matrix 110, though a more consistent approach would be to employ the assumption just described and then scale the bit values to the desired or true system voltages just prior to the waveform generation process.

The first row 120*a* is populated with the voltages of the various bits in the input waveform 100 scaled by the weight $W_1$ of the first DTF tap. In this example $W_1$=1, so the row values equal the original bit values. The second row 120*b* comprises a UI-shifted version of the voltages in row 120*a* as further scaled by the weight $W_2$ of the second DTF tap. Thus, it can be seen that 1 Volt in the first column of row 120*a* has become −0.5 Volts in the second column of row 120*b*, and so on. The third row 120*c* comprises a double UI-shifted version of the voltages in row 120*a* as further scaled by the weight $W_3$ of the third DTF tap. Thus, it can be seen that 1 Volt in the first column of row 120*a* has become +0.2 Volts in the third column of row 120*b*, and so on. If there were further taps, still other rows would be added, with their entries scaled by the corresponding tap's weight, and likewise shifted by a number of UIs. To be more explicit, if each Xth tap in the DTF being modeled is delayed by (N-X) unit intervals as previously described, then the Xth row in the matrix 110 comprises the sequential series of voltages (waveform 100) scaled by the Xth tap's weight and shifted by (X-1) columns.

Because each of rows 120*b*, 120*c*, and so on, are shifted by an increasing number of UIs and the bit values preceding the example sequence are unknown, the initial columns in each of those rows are populated with zeros 125 as shown.

Figure 4:
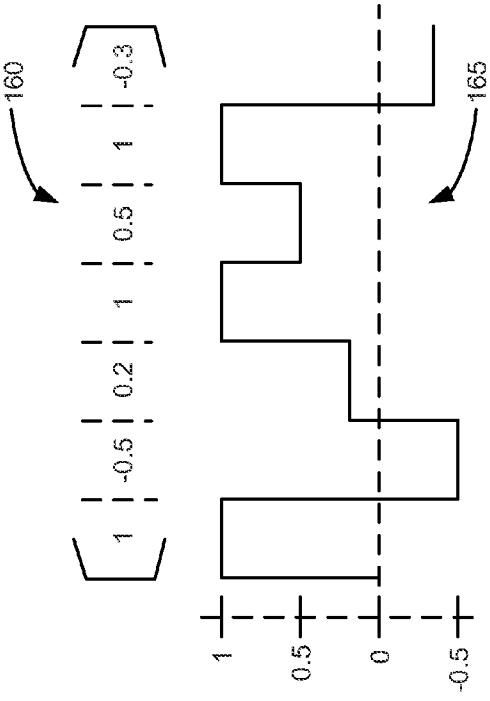

The next processing step is to use the computer system to sum the elements in each of the columns from matrix 110 to create a vector 160, as shown in FIG. 4. For example, values 1, 0, and 0 are added together from the first column to populate value 1 as the first entry in vector 160, and likewise for the other columns from matrix 110.

The resulting vector 160 in FIG. 4 models the waveform 165 that would result when the initial waveform 100 (FIG. 3) passes through the DTF 13. However, as should be appreciated, this idealized waveform 165 is arrived at very quickly, and without the need to lay out the DTF, and otherwise simulate the passage of initial waveform 100 through the lay out.

With vector 160/waveform 165 derived as just discussed, that vector/waveform can now be simulated to assess the DTF's ability (at least, as initially contemplated, with three taps weighted at $W_1$=+1.0, $W_2$=−0.5, and $W_3$=+0.2) to negate ISI caused by the channel 16. However, prior to the use of vector 160/waveform 165 in a simulation of this sort, it preferable to undertake further processing steps.

Figure 5:
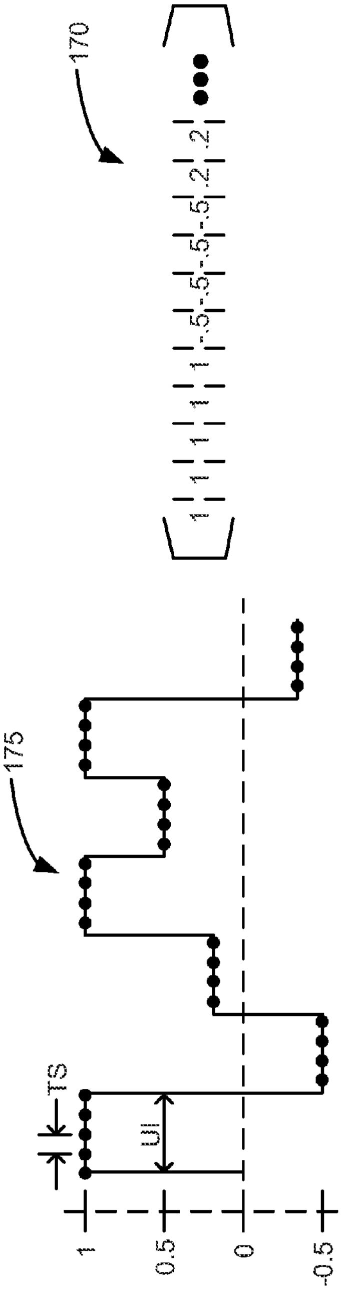

For example, in FIG. 5, vector 160/waveform 165 has been reconfigured as a simulation vector 170 which describes the resulting waveform 165 on a time step (TS) basis. Waveform 175 corresponds to vector 170 and shows the creation of the waveform using the time steps. As one skilled in the art will recognize, many circuit simulators, such as SPICE™, process input waveforms specified on the basis of a minimum time step, which may be as low as 1 picosecond for example. Specifying the waveform with such fine granularity allows for essentially smooth waveforms to be simulated, resulting in improved precision of the simulation of those waveforms. A small time step however also adds to processing time as each data point in the simulation vector 170 must be accounted for during simulation. In any event, converting the vector 160/waveform 165 to a simulation vector 170 based on a time step is a common conversion which can take place automatically within a simulation software package. Accordingly, such conversion is not further discussed.

Figure 6:
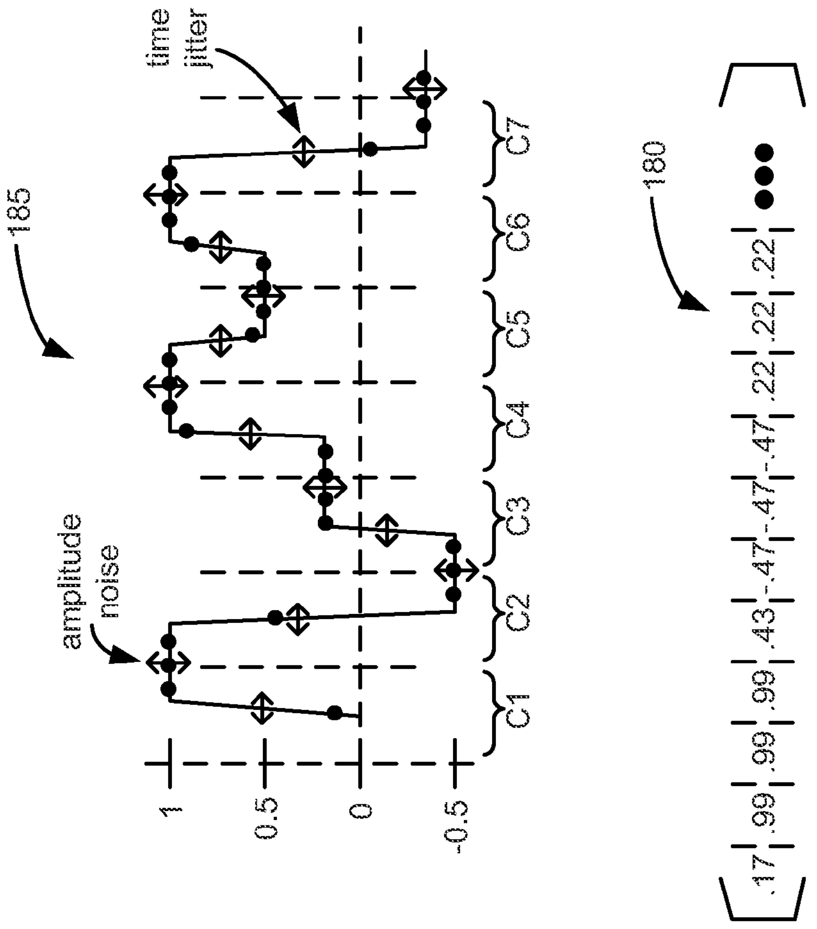
FIG. 6 illustrates an optional additional step to the process of FIGS. 3-5 in which noise or jitter is added to the simulation vector.

This technique is also easily modified to allow for the addition of amplitude noise or timing jitter, as shown in FIG. 6. As shown, waveform 185, and its corresponding vector 180, comprise modifications to vector 170/waveform 175 that add variable amplitude noise and/or timing jitter. Such noise or jitter may vary randomly or deterministically from cycle to cycle. For example, notice that the waveform 185 has been subdivided into a number of cycles, C1, C2, etc., with the edges of the cycles occurring between the transitions in the data. The amplitude noise, timing jitter or other time domain aspects can be randomly assigned to each cycle, thereby allowing for the resulting vector 180/waveform 185. A computationally-efficient way of adding noise and/or jitter is disclosed in U.S. patent application Ser. No. 11/549,646, filed Oct. 14, 2006, which is hereby incorporated by reference in its entirety. To briefly review one embodiment of the technique disclosed in the '646 application, a method implementable in a computer system for generating a time-domain signal (such as vector 180/waveform 185) with a time step for simulation having a noise component is disclosed, wherein the input to the method comprises an input waveform of a plurality of cycles (such as from waveform 170/vector 175). First, at least one time-domain aspect (e.g., high or low voltage level; or risetime or a falltime) of the input waveform is provided into the computer system for each cycle of the input waveform, in which the time-domain aspect varies between the cycles. Next, a set of transform coefficients is calculated for each cycle of the input waveform using a finite number of harmonic frequencies using the computer system, in which the transform coefficients are calculated as a function of the at least one time-domain aspect of the waveform. Then a time-domain cycle is computed for each set of transform coefficients using the computer system, in which the time domain aspects have a time resolution smaller than the time step. Finally, the time-domain signal is created with the time step by concatenating the plurality of time-domain cycles.

Additionally, periodic jitter (i.e., jitter that varies predictably from cycle to cycle) can also be added to the vector 170/waveform 175 to form the vector 180/waveform 185, as disclosed in U.S. patent application Ser. No. 11/738,193, filed Apr. 20, 2007, which is hereby incorporated by reference in its entirety. To briefly review one embodiment of the technique disclosed in the '193 application, a method implementable in a computer system for generating a multi-cycle signal vector suitable for use as the input to a circuit to be simulated in a simulation program is disclosed. The method first determines in the computer system a time shift value for each of a plurality of cycles of a signal to be simulated, in which the time shift values vary periodically between the plurality of cycles, and wherein the time shift values are further phase shifted by a phase shift in each of the cycles. Next each determined time shift value is applied to create a time shifted vector for each of the plurality of cycles, wherein each time shifted vector comprises a sequence of voltage values each separated by a time step. Finally, the plurality of time shifted vectors are concatenated to create the multi-cycle signal vector.

Regardless of the technique used, a time-step-based vector 180 complete with random noise and jitter is created from otherwise-ideal vector 170/waveform 175. The result is a simulatable vector 180 which is highly realistic, and which truly allows for accurate simulation and modeling of the DTF 13. Note that the techniques disclosed in the '646 and '193 applications are not the only way to add noise or jitter to the vector 170/waveform 175 to form vector 180/waveform 185, and previous or future methods for doing so could also be used.

Figure 7:
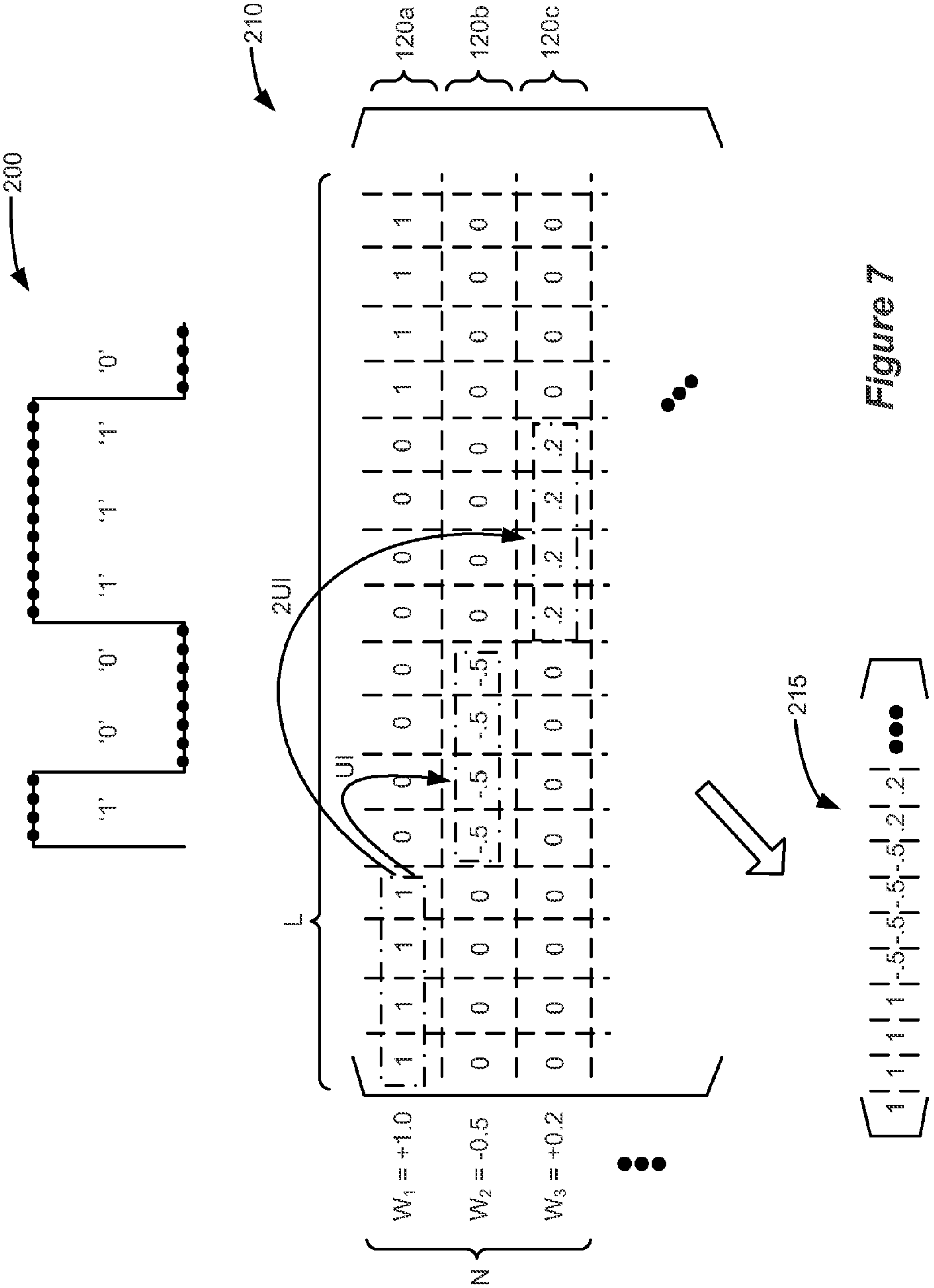
FIG. 7 illustrates a modification to the technique disclosed in FIGS. 3-5 in which a time-step-based matrix is used to form the vector for simulation indicative of the output of the DTF of FIG. 2.

An alternative embodiment of the disclosed technique is shown in FIG. 7. Like FIG. 3, FIG. 7 depicts an ideal waveform 200 which the designer of the DTF 13 would like to see simulated through the DTF 13/channel 16 system and its corresponding matrix 210. However, unlike FIG. 3, the waveform 200 and corresponding matrix 210 are time-step (TS) based, not unit-interval (UI) based. In other words, prior to populating the matrix 210, the ideal waveform 200 has been defined by time steps. From this waveform 200, matrix 210 is populated such that the number of columns L equals the number of time steps, instead of the number of unit intervals M as was the case in FIG. 3. Because the waveform 200 will usually contain many more time steps than unit intervals, the result is a larger matrix 210 to be processed, but this is not problematic assuming the computer system can handle such additional processing.

As before, the matrix 210 is constructed of N rows, where N equals the number of taps assumed for the DTF design. And as before, row 120*a* is populated with the voltage values for the time-step-based waveform 200 scaled by the weight W1, which, because in this example W1=1, essentially comprises the time-step-based vector for the waveform 200. Subsequent rows (e.g., 120*b* and 120*c*) are once again populated with shifted versions of the original voltages as further scaled by the remaining weights of the DTF. However, as applied to matrix 210, each row is still shifted by full unit intervals (UI), with row 120*b* being shifted by one UI, row 120*c* shifted by two UIs, etc. Generically, speaking, each Xth row comprises the time-step-based waveform scaled by the Xth tap's weight shifted by a fixed number of time steps times (X-1).

Because there will be a number of time steps in each unit interval, in reality this means that the data for the subsequent rows 120*b*, 120*c*, etc. may need to be shifted by many columns. However, as shown in FIG. 7, the data is shown as shifted by only four columns for each row, suggesting that there are four time steps within each unit interval of waveform 200. However, it should be mentioned that each row can be shifted by a fixed number of time steps not exactly equaling a full unit interval, a modification which is especially appropriate when fractional unit-interval-spaced filtering is desired, as discussed further below. However, for the purpose of FIG. 7, full unit interval shifts are shown for ease of understanding.

From this point, matrix 210 is otherwise processed as described previously, with the elements in each column summed to form a vector 215. Because the initial matrix 210 was already time-step based, the time-step conversion step of FIG. 5 is not necessary. The result is a vector 215 ready for simulation that is indicative of the output of the (at least initial) design of the DTF 13, which vector 215 can then be simulated as passing through a channel 16 to verify the DTF's design. (Notice that vector 215, arrived at via a time-step-based matrix 210, is the same as the vector 170 arrived at via a unit-interval-based matrix 110; see FIG. 5).

Figure 8A:
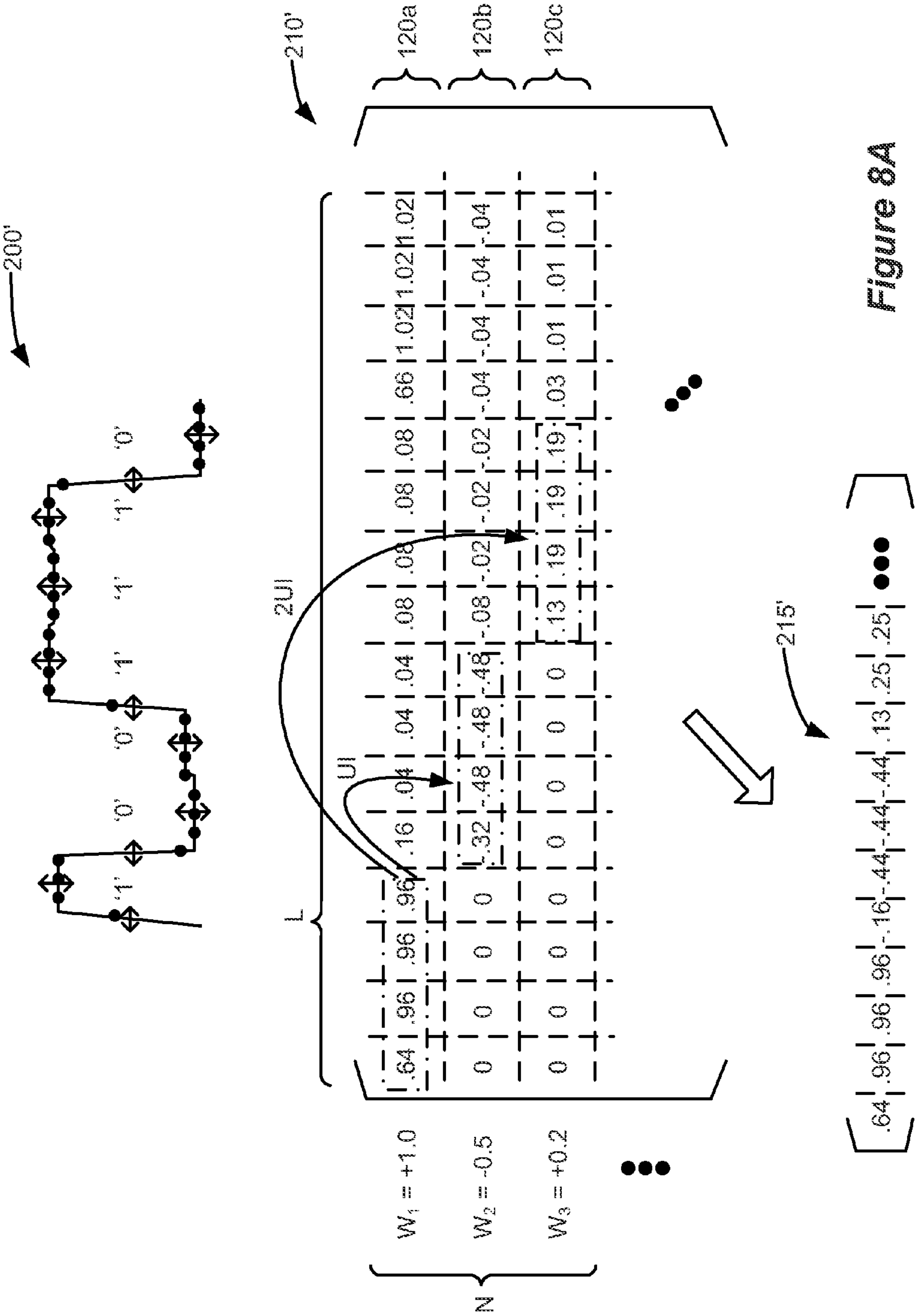
FIGS. 8A and 8B illustrate optional additional steps to the process of FIG. 7 in which noise or jitter is added to the simulation vector either before or after processing of the matrix.

Noise and/or jitter can also easily be added to the processing even when an expanded time-step-based matrix 210 is used. Such noise or jitter can be added either before or after processing of the matrix 210. FIG. 8A shows an example in which noise or jitter is added prior to matrix 210 population and processing. As shown, the initial time-step-based waveform 200 (see FIG. 7), prior to population in the matrix 210', is modified to add noise or jitter resulting in waveform 200'. Once again, the techniques disclosed in U.S. patent application Ser. Nos. 11/549,646 and 11/738,193, incorporated by reference above, can be employed to add noise or jitter to the otherwise ideal waveform 200. Thereafter, the matrix 210' can be populated and processed as described above with respect to FIG. 7 to arrive at a jittered vector 215' ready for simulation with a much more realistic picture of how noise or jitter will affect the system.

Figure 8B:
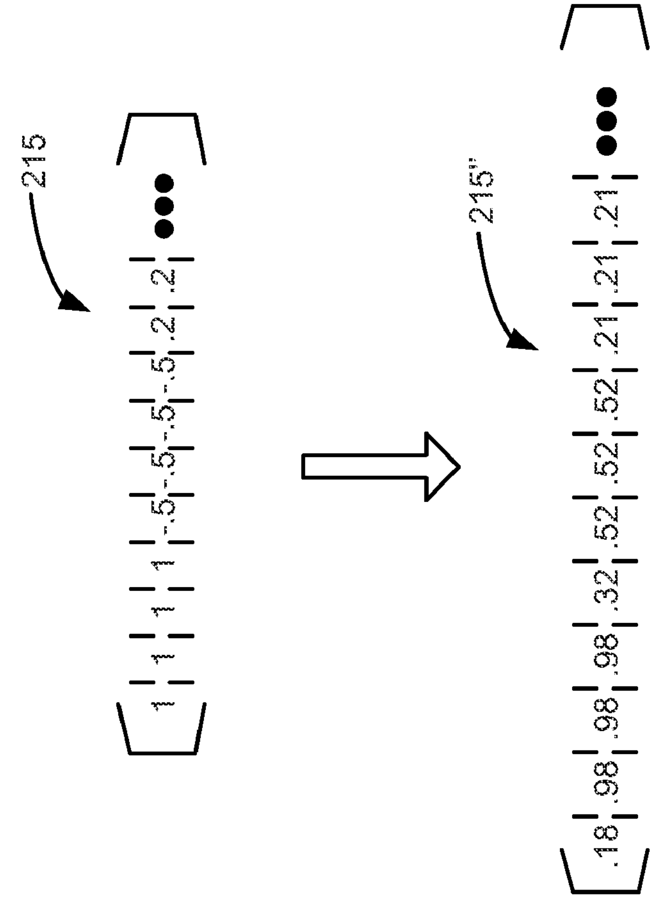

FIG. 8B shows an example in which noise or jitter is added after matrix 210 processing. Such post-processing is essentially the same as that illustrated in FIG. 6, in which noise or jitter was added to an otherwise idealized time-step-based vector 170 to form a new jittered vector 180. Likewise, in FIG. 8B, the idealized time-step-based vector 215 formed from processing matrix 210 (FIG. 7) is modified by the above-incorporated noise and jitter addition techniques to form a new vector 215". Again, the result is a vector 215" ready for simulation with a much more realistic picture of how noise or jitter will affect the system.

It should be noted that vectors 215' (FIG. 8A) and 215" (FIG. 8B) are shown as exhibiting different values, which is a possibility as the two vectors correspond to incorporation of noise and jitter at different steps in the filtering process. However, it is not necessarily the case that pre- and post-matrix-processing of noise and jitter would lead to different vector values.

While the methods above all pertain to unit-interval-spaced filtering, they are easily extended to fractions of unit-interval-spaced filtering. This can be accomplished by simply scaling the number of bits and the final time step appropriately in either the unit-interval-based or the time-step-based approaches.

For example, if a half-unit-interval-spaced DTF were desired, the first modification would be to repeat every bit value in the original data stream once (e.g., '0101100' would become '00110011110000'), which essentially amounts to a coarse unit-interval-based to time-step-based conversion. Now when the matrix 110 is populated (see FIG. 3), the columns are assumed to represent half-unit-interval blocks of time, and hence, the taps operate in half-unit-interval steps. The remaining processing operations would remain identical to the process already described, up to the point of applying the time step and generating the simulatable waveform.

Because this proposed modification doubles the length of the resulting vector 160 (see FIG. 4), the relative time step must also be doubled when generating the simulatable vector 170 (see FIG. 5) to maintain the original frequency of the data being modeled. Of course, this same modification could be extended to a third-unit-interval-spaced filter, etc. In other words, because each Xth tap in the DTF is delayed by (N-X)/F unit intervals, in which F is indicative of a fraction of the fractional unit interval spaced DTF (i.e., F=2 for a ½ fractional DTF), each column of the matrix represents 1/F of a unit interval, and each Xth row comprises the input voltages scaled by the Xth tap's weight shifted by (X-1) columns. The process is similar for an embodiment in which the matrix is time-step based, and in that case the Xth row comprises the time-step-based waveform scaled by the Xth tap's weight shifted by (X-1)/F unit intervals number of columns.

The processes described herein may be further extended to automate the filter design within a computer system. Previously it was mentioned that the designer would likely vary the number and weights of the filter taps manually, and through trial and error converge to the filter configuration that best counters the impact of the transmission channel. If an error metric can be established and measured from within the simulation (e.g., residual ISI, etc.), then it is possible to let the simulator vary the number and weights of the filter taps autonomously, with the only input from the designer being the initial guess. While the process for doing so will not be discussed here, those skilled in the art recognize that the process of in-situ DTF filter adaptation has been well understood for decades. See, e.g., R. W. Lucky et al., "Automatic equalization for digital communication," in Proc. IEEE, vol. 53, no. 1, pp. 96-97 (January 1965) (incorporated above).

Finally, it should also be noted that while similar filtering of clock signals is not a standard procedure, the methods described above apply not only to random or pseudo-random data signals, but to periodic clock signal modeling as well.

One skilled in the art will realize that the disclosed techniques are usefully implemented as software running on a computer system, and ultimately stored in a computerized-readable media, such as a disk, semiconductor memory, or other media discussed below. Such a computer system can be broadly construed as any machine or system of machines capable or useful in reading and executing instructions in the software program and making the various computations embodiments of the disclosed techniques require. Usually, embodiments of the disclosed techniques would be implemented as programs installable on a circuit designer's workstation or work server. Moreover, embodiments of the disclosed techniques can easily be incorporated into pre-existing circuit simulation software packages, such as those mentioned previously.

Figure 9:
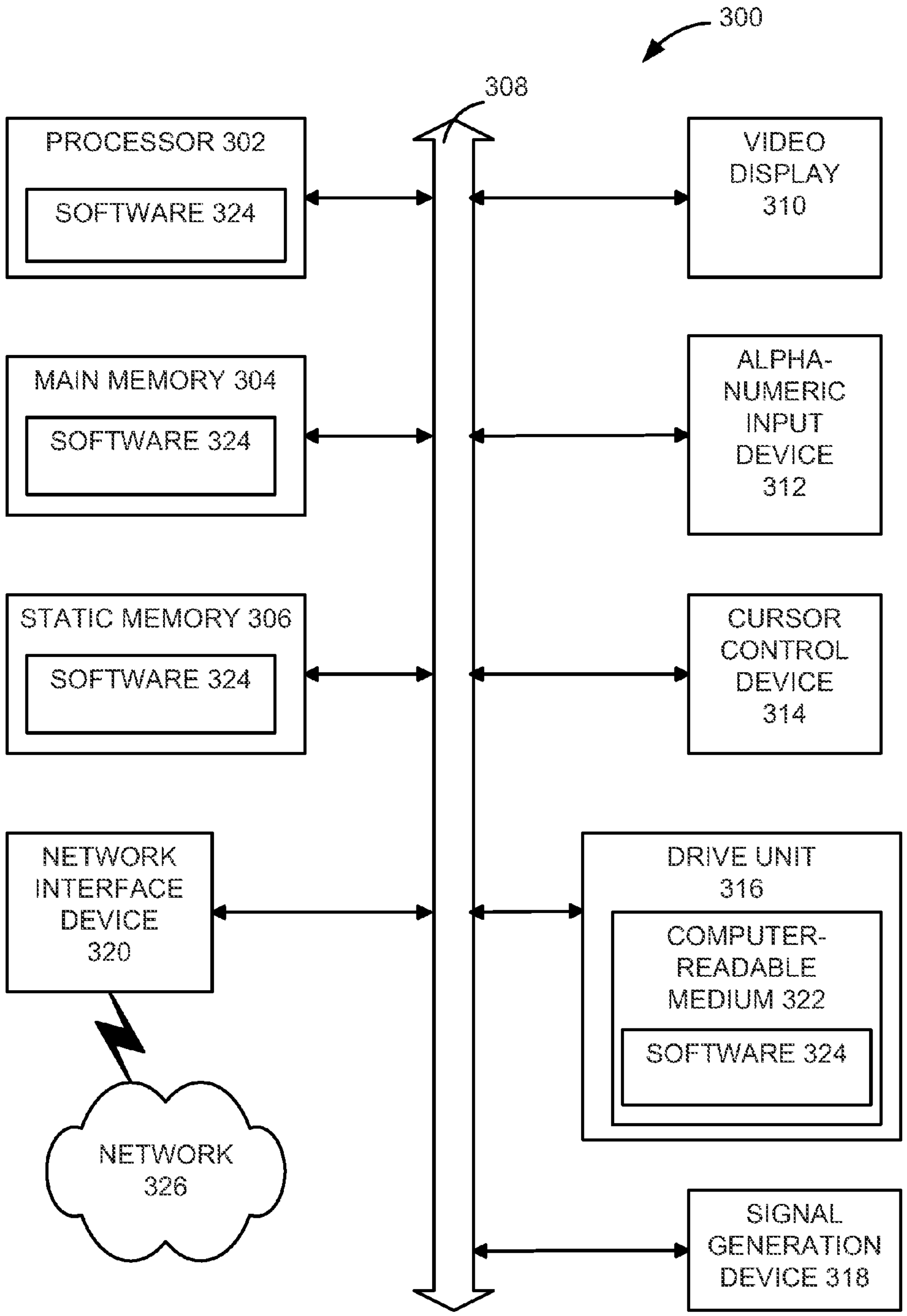
FIG. 9 illustrates a computer system in which embodiments of the disclosed techniques may be implemented, and illustrates the techniques as embodied in computer-readable media.

FIG. 9 is a block diagram of an exemplary computer system 300 within which a set of instructions, for causing the machine to perform any one or more of the techniques described herein, may be executed. In alternative embodiments, the computer system 300 operates as a standalone device or may be connected (e.g., networked) to other computer systems. In a networked deployment, the system 300 may operate in the capacity of a server or a client machine in a server-client network environment, or as a peer machine in a peer-to-peer (or distributed) network environment. The computer system 300 may be a personal computer (PC), a workstation such as those typically used by circuit designers, a set-top box (STB), a Personal Digital Assistant (PDA), a cellular telephone, a web appliance, a network router, switch or bridge, or any machine capable of executing a set of instructions that specify actions to be taken by that machine, and networked versions of these.

The exemplary computer system 300 includes a processor 302 (e.g., a central processing unit (CPU), a graphics processing unit (GPU) or both), a main memory 304 and a static memory 306, which communicate with each other via a bus 308. The computer system 300 may further include a video display unit 310 (e.g., a liquid crystal display (LCD) or a cathode ray tube (CRT)). The computer system 300 also includes an alphanumeric input device 312 (e.g., a keyboard), a user interface (UI) navigation device 314 (e.g., a mouse), a disk drive unit 316, a signal generation device 318 (e.g., a speaker) and a network interface device 320.

The disk drive unit 316 includes a computer-readable medium 322 on which is stored one or more sets of instructions and/or data structures (e.g., software 324) embodying embodiment of the various techniques disclosed herein. The software 324 may also reside, completely or at least partially, within the main memory 304 and/or within the processor 302 during execution thereof by the computer system 300, the main memory 304 and the processor 302 also constituting computer-readable media.

The software 324 and/or its associated data may further be transmitted or received over a network 326 via the network interface device 320 utilizing any one of a number of well-known transfer protocols (e.g., HTTP).

While the computer-readable medium 322 is shown in an exemplary embodiment to be a single medium, the term "computer-readable medium" should be taken to include a single medium or multiple media (e.g., a centralized or distributed database, and/or associated caches and servers) that store the one or more sets of instructions. The term "computer-readable medium" shall also be taken to include any medium that is capable of storing, encoding or carrying a set of instructions for execution by the machine and that cause the machine to perform any one or more of the methodologies of the disclosed techniques, or that is capable of storing, encoding or carrying data structures utilized by or associated with such a set of instructions. The term "computer-readable medium" shall accordingly be taken to include, but not be limited to, solid-state memories, optical and magnetic media such as discs, and carrier wave signals.

Embodiments of the disclosed techniques can also be implemented in digital electronic circuitry, in computer hardware, in firmware, in special purpose logic circuitry such as an FPGA (field programmable gate array) or an ASIC (application-specific integrated circuit), in software, or in combinations of them, which again all comprise examples of "computer-readable media." When implemented as software, such software can be written in any form of programming language, including compiled or interpreted languages, and it can be deployed in any form, including as a stand-alone program or as a module, component, subroutine, or other unit suitable for use in a computing environment. A computer program can be deployed to be executed on one computer or on multiple computers at one site or distributed across multiple sites and interconnected by a communication network.

Processors 302 suitable for the execution of a computer program include, by way of example, both general and special purpose microprocessors, and any one or more processors of any kind of digital computer. Generally, a processor will receive instructions and data from a read-only memory or a random access memory or both.

To provide for interaction with a user, the invention can be implemented on a computer having a video display 310 for displaying information to the user and a keyboard and a pointing device such as a mouse or a trackball by which the user can provide input to the computer. Other kinds of devices can be used to provide for interaction with a user as well. For example, feedback provided to the user can be any form of sensory feedback, such as visual feedback, auditory feedback, or tactile feedback; and input from the user can be received in any form, including acoustic, speech, or tactile input.

Aspects of the disclose techniques can employ any form of communication network. Examples of communication networks 326 include a local area network ("LAN"), a wide area network ("WAN"), and the Internet.

It should be understood that the disclosed techniques can be implemented in many different ways to the same useful ends as described herein. In short, it should be understood that the inventive concepts disclosed herein are capable of many modifications. To the extent such modifications fall within the scope of the appended claims and their equivalents, they are intended to be covered by this patent.

What is claimed is:

1. A non-transitory computer-readable medium containing instructions for performing a method implementable in a computer system for producing a vector indicative of the output of a discrete time filter (DTF) in response to a waveform comprising a sequential series of voltages each comprising a unit interval, wherein the DTF comprises a plurality of taps with corresponding weights, the method comprising:

- receiving the number N of taps and each taps' corresponding weight in the computer system, wherein each Xth tap is delayed by (N-X) unit intervals;
- populating a matrix with N rows and M columns in the computer system, wherein each column represents a unit interval, and wherein an Xth row comprises the sequential series of voltages scaled by the Xth tap's weight shifted by (X-1) columns;
- adding in the computer system the columns of the matrix to produce a vector indicative of the DTF output; and
- simulating in the computer system a response of the produced vector.

2. The non-transitory computer-readable medium of claim 1, wherein the waveform is input as a set of user-defined values.

3. The non-transitory computer-readable medium of claim 1, wherein the vector indicative of the DTF output is further processed to define a time-step-based vector prior to simulating in the computer system.

4. The non-transitory computer-readable medium of claim 3, wherein the time-step-based vector is further processed prior to simulating in the computer system to add amplitude noise and/or timing jitter.

5. The non-transitory computer-readable medium of claim 1, wherein simulating comprises using the produced vector as an input to a channel having a transfer function.

6. The non-transitory computer-readable medium of claim 5, wherein the number N of taps and each taps' corresponding weight are chosen to model an inverse of the transfer function of the channel.

7. The non-transitory computer-readable medium of claim 1, wherein the voltages are scaled.

8. A non-transitory computer-readable medium containing instructions for performing a method implementable in a computer system for producing a vector indicative of the output of a discrete time filter (DTF) in response to a waveform, wherein the waveform comprises a time-step-based waveform, wherein the DTF comprises a plurality of taps with corresponding weights, comprising:

- receiving the number N of taps and each taps' corresponding weight in the computer system, wherein each Xth tap is delayed by (N-X) unit intervals;
- populating a matrix with N rows and L columns in the computer system, wherein each column represents a time step, and wherein an Xth row comprises the time-step-based waveform scaled by the Xth tap's weight shifted by (X-1) unit intervals;
- adding in the computer system the columns of the matrix to produce a vector indicative of the DTF output; and
- simulating in the computer system a response of the produced vector.

9. The non-transitory computer-readable medium of claim 8, wherein the time-step-based waveform is converted from a unit-interval-based waveform in the computer system.

10. The non-transitory computer-readable medium of claim 8, wherein the vector is further processed to add amplitude noise and/or timing jitter prior to simulating in the computer system.

11. The non-transitory computer-readable medium of claim 8, further comprising, prior to populating the matrix, modifying the time-step-based waveform to add amplitude noise and/or timing jitter.

12. The non-transitory computer-readable medium of claim 8, wherein simulating comprises using the produced vector as an input to a channel having a transfer function.

13. The non-transitory computer-readable medium of claim 12, wherein the number N of taps and each taps' corresponding weight are chosen to model an inverse of the transfer function of the channel.

14. A non-transitory computer-readable medium containing instructions for performing a method implementable in a computer system for producing a vector indicative of the output of a fractional unit interval spaced discrete time filter (DTF) in response to a waveform comprising a sequential series of voltages each comprising a unit interval, wherein the DTF comprises a plurality of taps with corresponding weights, comprising:

- receiving the number N of taps and each taps' corresponding weight in the computer system, wherein each Xth tap is delayed by (N-X)/F unit intervals, wherein F comprises an integer indicative of a fraction of the fractional unit interval spaced DTF;
- populating a matrix with N rows and M columns in the computer system, wherein each column represents 1/F of a unit interval, and wherein an Xth row comprises the sequential series of voltages scaled by the Xth tap's weight shifted by (X-1) columns;
- adding in the computer system the columns of the matrix to produce a vector indicative of the DTF output; and
- simulating in the computer system a response of the produced vector.

15. The non-transitory computer-readable medium of claim 14, wherein the waveform is input as a set of user-defined values.

16. The non-transitory computer-readable medium of claim 14, wherein the vector indicative of the DTF output is further processed to define a time-step-based vector prior to simulating in the computer system.

17. The non-transitory computer-readable medium of claim 16, wherein the time-step-based vector is further processed prior to simulating in the computer system to add amplitude noise and/or timing jitter.

18. The non-transitory computer-readable medium of claim 14, wherein simulating comprises using the produced vector as an input to a channel having a transfer function.

19. The non-transitory computer-readable medium of claim 18, wherein the number N of taps and each taps' corresponding weight are chosen to model an inverse of the transfer function of the channel.

20. A non-transitory computer-readable medium containing instructions for performing a method implementable in a computer system for producing a vector indicative of the output of a fractional unit interval spaced discrete time filter (DTF) in response to a waveform, wherein the waveform comprises a time-step-based waveform, wherein the DTF comprises a plurality of taps with corresponding weights, comprising:

receiving the number N of taps and each taps' corresponding weight in the computer system, wherein each Xth tap is delayed by (N-X)/F unit intervals, wherein F comprises an integer indicative of a fraction of the fractional unit interval spaced DTF;

populating a matrix with N rows and L columns in the computer system, wherein each column represents a time step, and wherein an Xth row comprises the time-step-based waveform scaled by the Xth tap's weight shifted by (X-1)/F unit intervals;

adding in the computer system the columns of the matrix to produce a vector indicative of the DTF output; and simulating in the computer system a response of the produced vector.

21. The non-transitory computer-readable medium of claim 20, wherein the time-step-based waveform is converted from a unit-interval-based waveform in the computer system.

22. The non-transitory computer-readable medium of claim 20, wherein the vector is further processed prior to simulating in the computer system to add amplitude noise and/or timing jitter.

23. The non-transitory computer-readable medium of claim 20, further comprising, prior to populating the matrix, modifying the time-step-based waveform to add amplitude noise and/or timing jitter.

24. The non-transitory computer-readable medium of claim 20, wherein simulating comprises using the produced vector as an input to a channel having a transfer function.

25. The non-transitory computer-readable medium of claim 24, wherein the number N of taps and each taps' corresponding weight model an inverse of the transfer function of the channel.

* * * * *